(12) United States Patent
Pasternak

(10) Patent No.: US 9,432,003 B2
(45) Date of Patent: Aug. 30, 2016

(54) MULTI-BIT STANDARD CELLS FOR CONSOLIDATING TRANSISTORS WITH SELECTIVE SOURCING

(71) Applicant: Synopsys, Inc., Mountain View, CA (US)

(72) Inventor: John Pasternak, San Jose, CA (US)

(73) Assignee: Synopsis, Inc., Mountain View, CA (US)

( * ) Notice: Subject to any disclaimer, the term of this patent is extended or adjusted under 35 U.S.C. 154(b) by 39 days.

(21) Appl. No.: 14/270,311

(22) Filed: May 5, 2014

(65) Prior Publication Data

US 2015/0318845 A1  Nov. 5, 2015

(51) Int. Cl.
*H03K 3/3562* (2006.01)
*G06F 17/50* (2006.01)

(52) U.S. Cl.
CPC ....... *H03K 3/35625* (2013.01); *G06F 17/5045* (2013.01)

(58) Field of Classification Search
CPC .............. H03K 3/012; H03K 3/0375; H03K 19/0008; H03K 19/0033; H03K 5/133; H03K 5/131

USPC ........ 327/198, 199, 201, 202; 716/104, 113, 716/119

See application file for complete search history.

(56) References Cited

U.S. PATENT DOCUMENTS 5,473,547 A * 12/1995 Muroga ................ G06F 17/505
716/104

\* cited by examiner

*Primary Examiner* — John Poos
(74) *Attorney, Agent, or Firm* — Bever, Hoffman & Harms, LLP

(57) ABSTRACT

A method for designing a standard cell, e.g. a multi-bit flip-flop, can include identifying a first set of transistors. This first set functions to source power or ground to circuits of the standard cell. A second set of transistors can be determined and correlated. This second set forms at least part of the first set of transistors. Each correlated group in the second set of transistors receives identical signals, e.g. scan enable, reset, and/or set signals, and provides a same sourcing. A third set of transistors can then be created. This third set has fewer transistors than the second set. The second set of transistors can be deleted in the standard cell. The third set of transistors can be connected to the circuits of the standard cell. This method can significantly extend circuit consolidation to improve the area benefit of multi-bit standard cells.

18 Claims, 6 Drawing Sheets

MULTI-BIT STANDARD CELLS FOR CONSOLIDATING TRANSISTORS WITH SELECTIVE SOURCING

RELATED ART

In the semiconductor industry, a standard cell refers to an application-specific integrated circuit (ASIC) design that includes logic functionality. Logic circuits capable of storing logic states (such as latches and flip-flops) are widely used in integrated circuit (IC) chips. Chip-area saving can be achieved by combining several flip-flop standard cells into a single, multi-bit flip-flop standard cell. Of interest, this standard cell can consolidate some transistor circuits with common functionality into a single set of transistor circuits used for all bits within the standard cell. Known, exemplary circuits with common functionality that have been consolidated in multi-bit flip-flops are clock buffers, clock inverters, and scan-enable inverters, as discussed below.

FIG. 1A illustrates an exemplary single-bit flip-flop standard cell 100 having reset, set, and scan capability. In this embodiment, flip-flop standard cell 100 includes the following serially-coupled circuits: a input block 101, a master latch 103, a transmission gate 104, a slave latch 105, and inverters 106, 107. Input block 101 receives a data input signal D and a scan input signal $S_i$. Master latch 103 and slave latch 105 both receive a reset/set signal Rd. Inverters 106, 107 generate a data output signal Q and a scan output SO, respectively. Flip-flop standard cell 100 further includes a control block 102, which is operatively coupled to input block 101, master latch 103, transmission gate 104, and slave latch 105. In this embodiment, control block 102 receives a clock signal CK and generates an inverted clock signal CKM and a buffered clock signal CKMN from the clock signal CK, and receives a scan enable signal $S_E$ and generates an inverted scan enable signal $S_E$ bar. These generated signals can be provided to the other blocks as shown in FIG. 1A. Inverters 106 and 107 can provide buffering for the Q and SO signals, respectively, of flip-flop 100.

FIG. 1B illustrates an exemplary multi-bit (2-bit) flip-flop standard cell 110, which includes two sets of serially-connected circuits. A first set of serially-connected circuits includes a input block 101A, a master latch 103A, a transmission gate 104A, a slave latch 105A, and inverters 106A, 107A. These circuits receive and generate substantially similar signals as those indicated in FIG. 1A. For example, the first set of serially-connected circuits receives a data signal D1 and generates an output signal Q1 and a scan output signal SO1. Other signals in the first set are not shown for simplicity.

A second set of serially-connected circuits includes an input block 101B, a master latch 103B, a transmission gate 104B, a slave latch 105B, and inverters 106B, 107B. These circuits also receive and generate signals substantially similar to those indicated in FIG. 1A. For example, the second set of serially-connected circuits receives a data signal D2 and generates an output signal Q2 and a scan output signal SO2. Other signals in the second set are not shown for simplicity. Notably, multi-bit flip-flop standard cell 110 includes a control block 102S that consolidates all transistor circuits with common control functionality into a single set of transistor circuits used for the bits of multi-bit flip-flop 110. Thus, instead of duplicating control block 102 for the first and second sets of circuits, only one control block 102S is shared by the first and second sets of circuits. The common transistor circuits of control block 102S include a single clock circuit that receives signal CK and generates signals CKM and CKMN as well as a single scan enable circuit that receives signal $S_E$ and generates inverted signal $S_E$ bar. Because the signal labels are the same as those shown in FIG. 1A, these labels are not shown in control block 102S for simplicity.

The use of control block 102S can provide significant area improvements compared to flip-flops that merely duplicate control block 102 for each additional bit of a multi-bit standard cell. However, a need arises for further circuit consolidation to achieve yet further area improvements.

SUMMARY OF THE DISCLOSURE

A method for designing a standard cell is described. Notably, this method can significantly extend circuit consolidation to improve the area benefit of multi-bit standard cells. This method includes identifying a first set of transistors. The first set of transistors function to source power or ground to circuits of the standard cell. A second set of transistors can be determined and correlated. The second set of transistors forms at least part of the first set of transistors. Each correlated group in the second set of transistors receives identical signals and provides a same sourcing. A third set of transistors can then be created. The third set of transistors has fewer transistors than the second set of transistors. The second set of transistors can be deleted in the standard cell. The third set of transistors can be connected to the circuits of the standard cell.

In one embodiment, the standard cell is a multi-bit flip-flop. In this case, the identical signals can include at least one of scan enable, reset, and set signals. In another embodiment, the standard cell is a Booth recorder. In this case, the identical signals can include at least one of enable and A1 signals.

The first set of transistors may be identical to the second set of transistors. Each of the third set of transistors may replace a plurality of the second set of transistors.

A multi-bit flip-flop is also described. For each bit of the multi-bit flip-flop, the device includes an input block for receiving a data input signal and a scan input signal, a master latch coupled to an output of the input block, and a slave latch coupled to an output of the master latch. The multi-bit flip-flop further includes a control block. The control block includes a first transistor set, a second transistor set, a first transistor, a second transistor, and a third transistor. The first transistor set is for receiving a clock signal, and generating a buffered clock signal and an inverted clock signal. The first transistor set is operatively coupled to the input block, the master latch, and the slave latch. The second transistor set is for receiving a scan enable signal, and generating an inverted scan enable signal. The second transistor set is operatively coupled to the input block. The first transistor is for receiving the scan enable signal. A source of the first transistor is connected to a high voltage source, and a drain of the first transistor is operatively connected to the input block. The second transistor is for receiving the inverted scan enable signal. A source of the second transistor is connected to a high voltage source, and a drain of the second transistor is operatively connected to the input block. The third transistor is for receiving a reset signal. A source of the third transistor is connected to a low voltage source, and a drain of the third transistor is operatively connected to the master latch and the slave latch.

In one embodiment, the multi-bit flip-flop further includes, for each bit of the multi-bit flip-flop, a transmission gate coupled between the master latch and the slave latch.

The first transistor may be a PMOS transistor. The second transistor may be an NMOS transistor. The third transistor may be an NMOS transistor.

DETAILED DESCRIPTION OF THE DRAWINGS

Figure 1A:
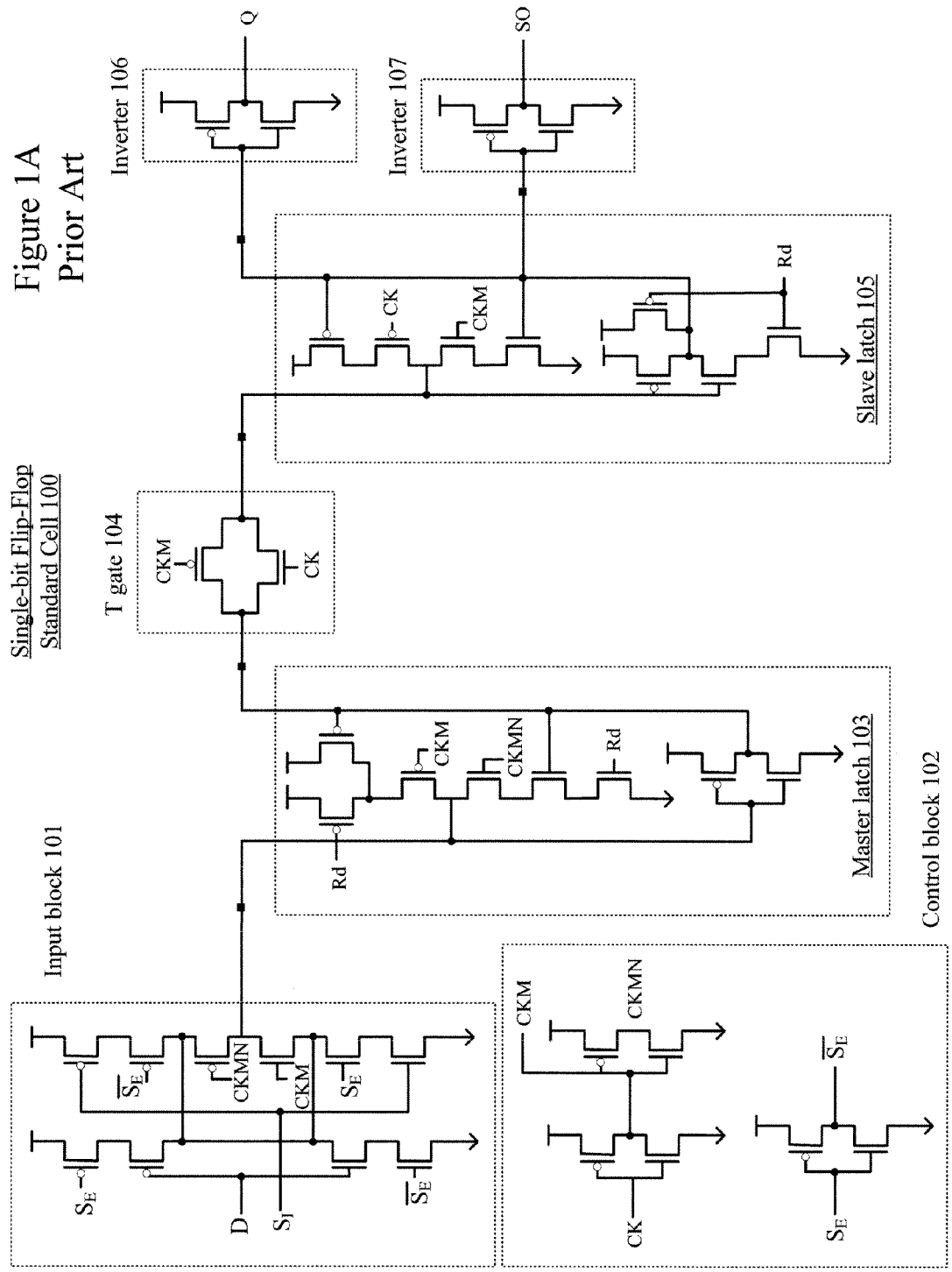
FIG. 1A illustrates an exemplary single-bit flip-flop standard cell.
Figure 1B:
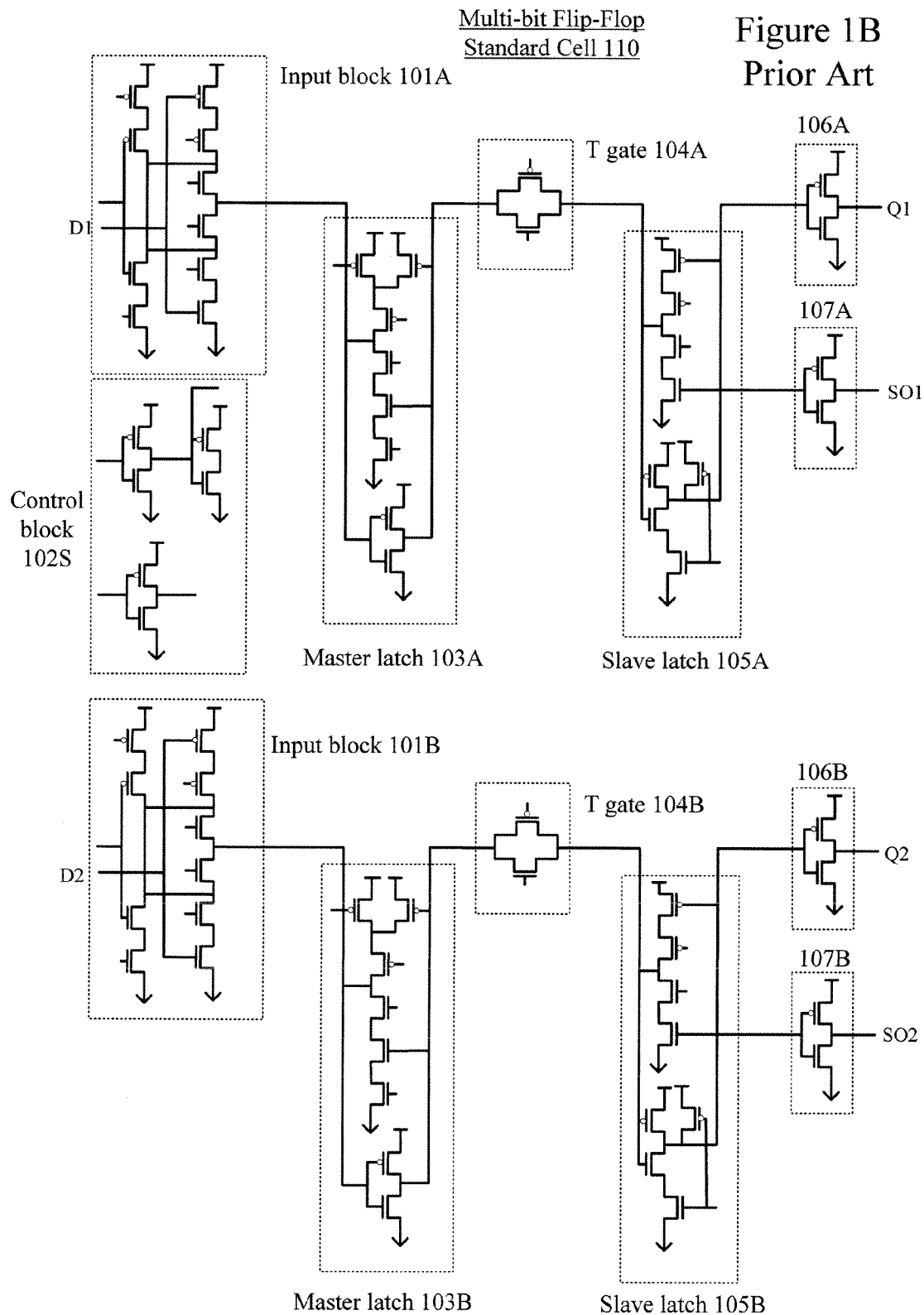
FIG. 1B illustrates an exemplary multi-bit flip-flop including a shared control block.
Figure 2:
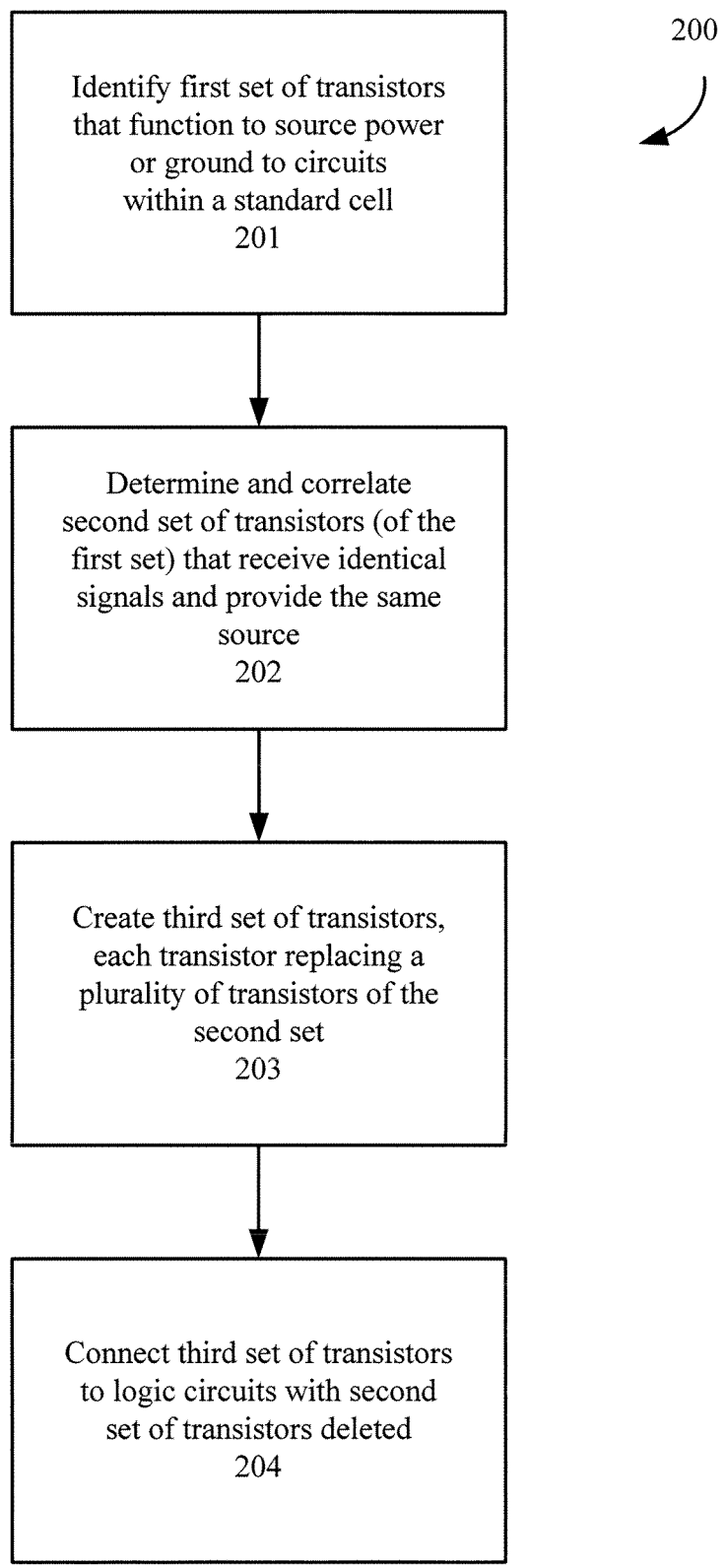
FIG. 2 illustrates a method for providing circuit consolidation by identifying transistors that function to source power or ground to logic circuits in a standard cell.

In accordance with the embodiments described herein, significant additional circuit consolidation (i.e. in addition to that noted in FIG. 1B) can be realized to further improve area benefits. FIG. 2 illustrates an exemplary method 200 that can provide these area benefits. In step 201, a first set of transistors can be identified. This first set of transistors functions to source power or ground to circuits within a standard cell. In step 202, a second set of transistors (forming part of the first set of transistors) can be determined and correlated. This second set of transistors includes those transistors that receive identical signals and provide the same source. In step 203, a third set of transistors can be created. In this third set, each transistor replaces a plurality of transistors of the second set for the standard cell. In step 204, the third set of transistors is connected to the logic circuits with the second set of transistors being deleted in the standard cell.

Figure 3A:
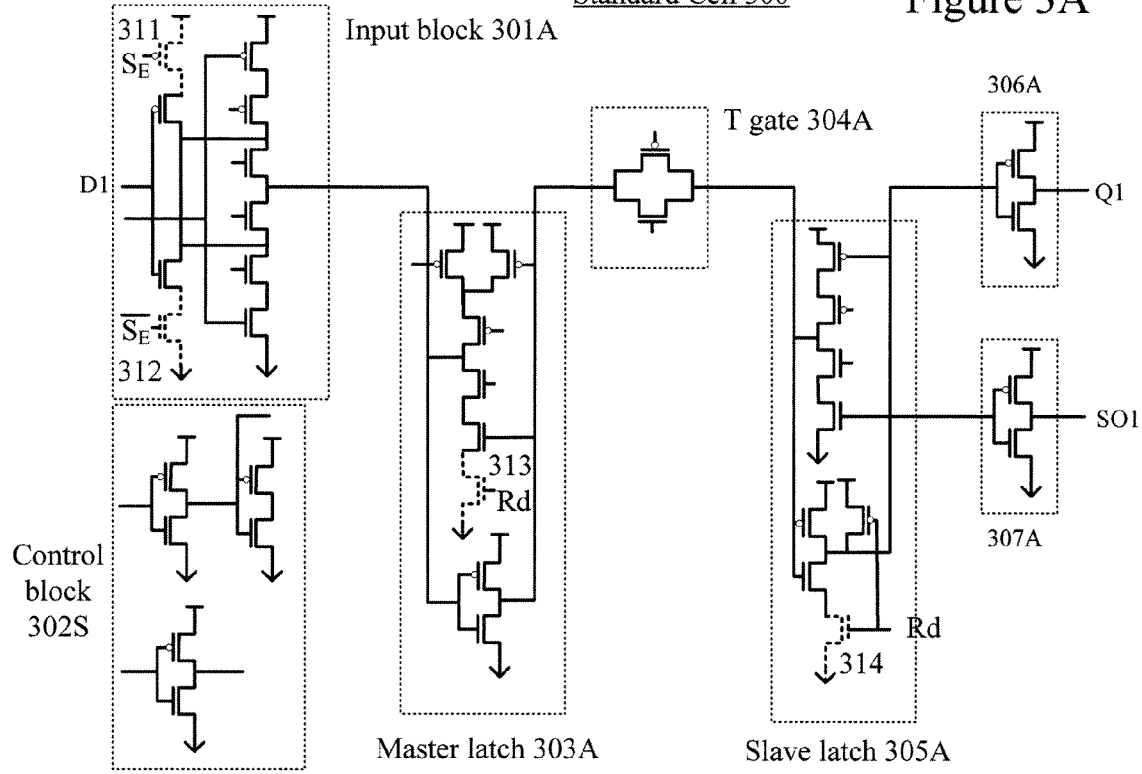
FIGS. 3A and 3B illustrates how the method of FIG. 2 can be implemented in an exemplary multi-bit flip-flop standard cell.
Figure 3A:
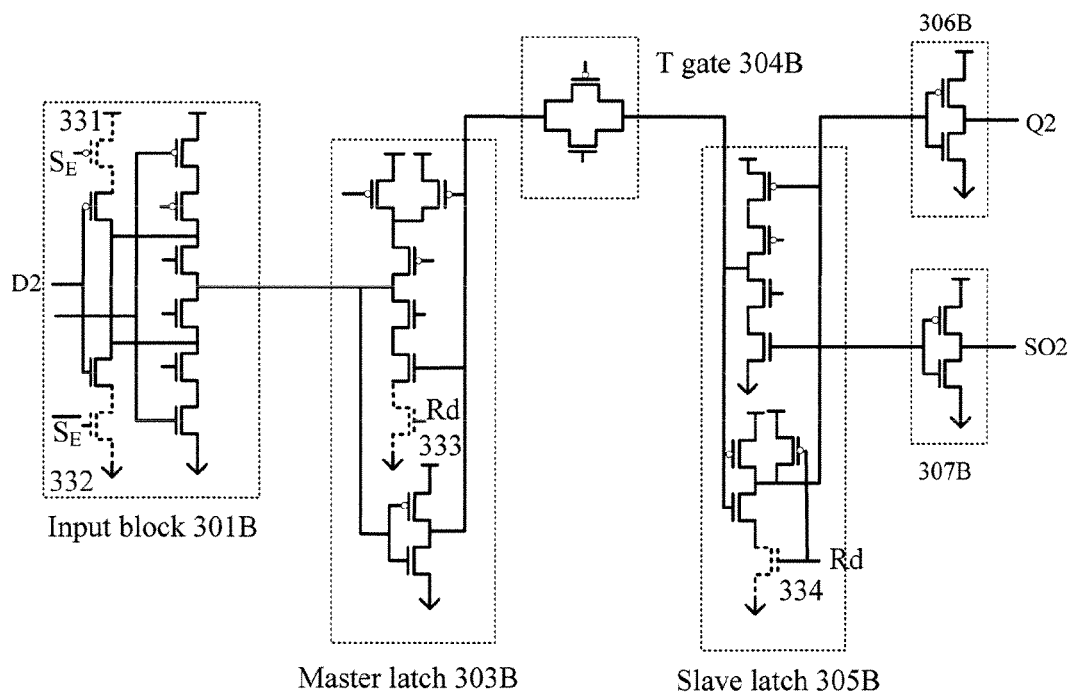
Figure 3B:
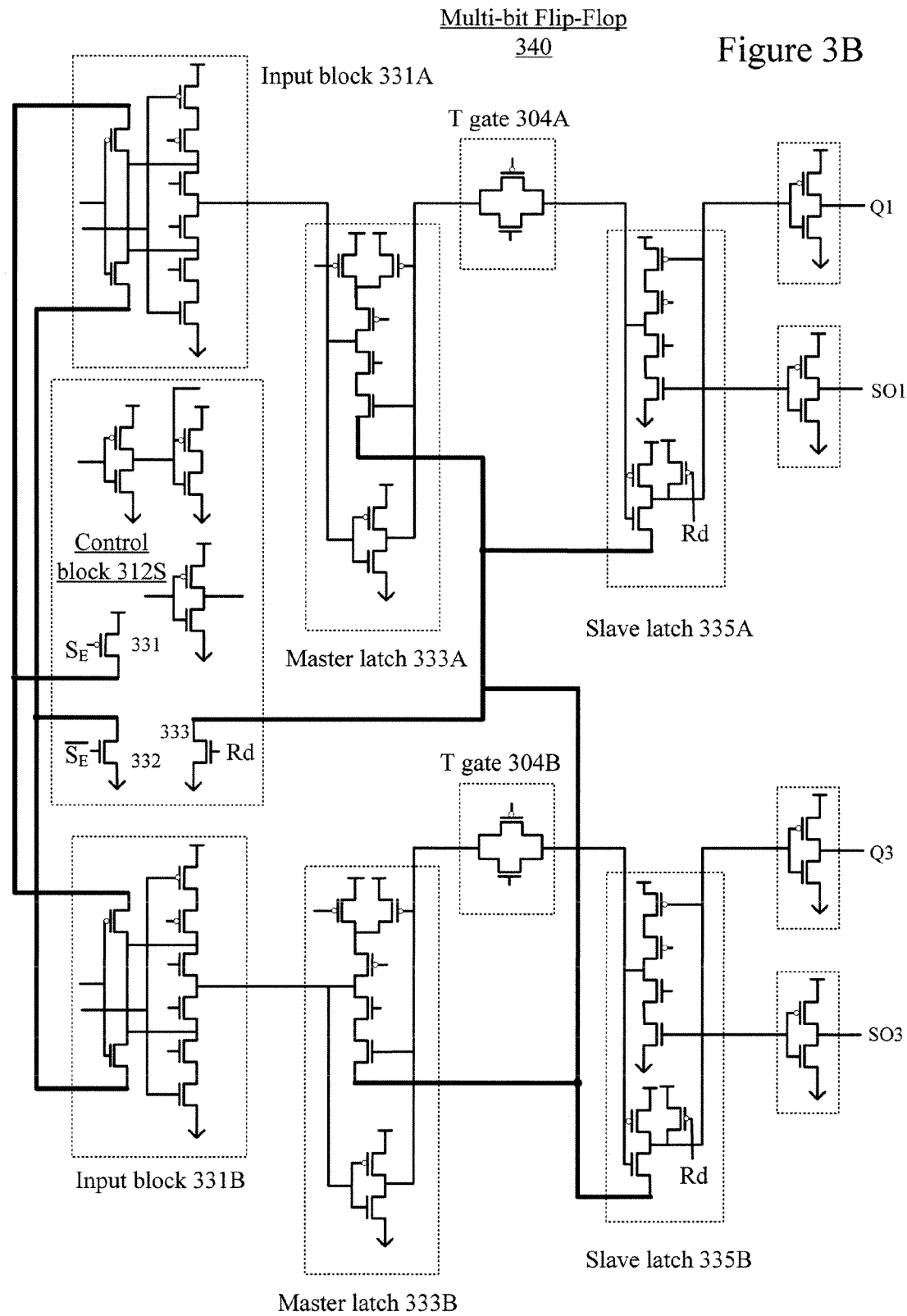

FIGS. 3A and 3B illustrates how method 200 can be implemented in an exemplary multi-bit flip-flop standard cell. FIG. 3A illustrates an exemplary multi-bit (2-bit) flip-flop 300, which includes two sets of serially-connected circuits (one set for each bit). A first set of serially-connected circuits includes an input block 301A, a master latch 303A, a transistor gate 304A, a slave latch 305A, and inverters 306A, 307A. These circuits receive and generate substantially similar signals as those indicated in FIG. 1A. For example, the first set of serially-connected circuits receives a data signal D1 and generates an output signal Q1 and a scan output signal SO1. Other signals in the first set are not shown for simplicity.

A second set of serially-connected circuits includes an input block 301B, a master latch 303B, a transistor gate 304B, a slave latch 305B, and inverters 306B, 307B. These circuits also receive and generate signals substantially similar to those indicated in FIG. 1A. For example, the second set of serially-connected circuits receives a data signal D2 and generates an output signal Q2 and a scan output signal SO2. Other signals in the second set are not shown for simplicity.

Multi-bit flip-flop 300 includes a control block 302S that consolidates all transistor circuits with common control functionality into a single set of transistor circuits used for the bits of multi-bit flip-flop 300. The common transistor circuits of control block 302S include a clock circuit that receives signal CK and generates signals CKM and CKMN (clock buffer and clock inverter) as well as a scan enable circuit that receives signal $S_E$ and generates inverted scan enable signal $S_E$ bar. Because the signal labels are the same as those shown in FIG. 1A, these labels are not shown in control block 302S for simplicity.

In accordance with step 201, a first set of transistors of flip-flop 300 can be identified. Notably, this first set of transistors function to source power or ground to logic circuits within flip-flop 300 (i.e. the exemplary standard cell). In FIG. 3A, the first set of transistors includes transistors 311, 312, 313, and 314 (forming part of input block 301A, master latch 303A, and slave latch 305A) as well as transistors 331, 332, 333, and 334 (forming part of input block 301B, master latch 303A, and slave latch 305A).

In accordance with step 202, a second set of transistors (forming part of the first set of transistors) can be determined and correlated. This second set of transistors includes those transistors that receive identical signals and provide the same source. In flip-flop 300, the second set of transistors includes transistors 311/331 (PMOS transistors that receive the scan enable signal $S_E$ and source the high voltage VDD to input blocks 301A and 301B), transistors 312/332 (NMOS transistors that receive the scan enable signal $S_E$ bar and source ground to input blocks 301A and 301B), transistors 313/333 (NMOS transistors that receive the reset/set signal Rd (wherein the reset signal can be characterized as an initialization of the logic circuit, and the set signal can be characterized as any subsequent resetting of the signal) and source ground to master latches 303A and 303B), and transistors 314/334 (NMOS transistors that receive the reset device signal Rd and source ground to slave latches 305A and 305B). Note that although in this example, the first and second sets of transistors are the same, this is not necessarily the case in all standard cells. Moreover, the second set of transistors can be correlated as indicated above to identify the transistors that receive the identical signals and provide the same source. Note that providing the same source includes two aspects: a first aspect being the type of transistor used (e.g. PMOS, NMOS, pfet, nfet, etc) and a second aspect being the source voltage (e.g. VDD or ground).

In accordance with steps 203 and 204, a third set of transistors can be created. Moreover, the third set of transistors is connected to the logic circuits with the second set of transistors being deleted in the standard cell. In this third set, each transistor replaces a plurality of transistors of the second set for the cell. FIG. 3B illustrates an exemplary flip-flop 340 including a third set of transistors for a multi-bit flip-flop. This third set of transistors includes a transistor 331 (a PMOS transistor that receives the scan enable signal $S_E$), a transistor 332 (an NMOS transistor that receives the scan enable signal $S_E$ bar), and a transistor 333 (an NMOS transistor that receives the reset signal Rd). Note that transistor 331 replaces transistors 311 and 331, transistor 332 replaces transistors 312 and 332, and transistor 333 replaces transistors 313, 314, 333, and 334. In this embodiment, transistors 331, 332, and 333 can be characterized as part of a control block 312S, which includes the circuits of control block 302S (FIG. 3) (i.e. clock and scan enable circuits).

Tables 1 and 2 demonstrate conventional transistor-count reductions achievable for multi-bit flip-flops per function and per flip-flop type, respectively.

TABLE 1

Conventional Practice for Multi-Bit Flip-Flop -
Transistor Count Reduction Per Function

| Multi-Bit count | CLOCK INV | SE INV | Reset INV | SET INV |
|---|---|---|---|---|
| 2 | 2 | 2 | 2 | 2 |
| 4 | 6 | 6 | 6 | 6 |
| 8 | 14 | 14 | 14 | 14 |
| 16 | 30 | 30 | 30 | 30 |

TABLE 2

Conventional Practice for Multi-Bit Flip-Flop -
Transistor Count Reduction Per Flip-Flop Type

| Multi-Bit count | No Scan | With Scan | Scan + reset | Scan + set/reset |
|---|---|---|---|---|
| 2 | 2 | 4 | 8 | 8 |
| 4 | 6 | 12 | 24 | 24 |
| 8 | 14 | 28 | 50 | 56 |
| 16 | 30 | 60 | 106 | 120 |

Tables 3 and 4 demonstrate the transistor-count reductions achievable for flip-flop 340 (FIG. 3B) compared to flip-flop 300 (FIG. 3A) per function and per flip-flop type, respectively.

TABLE 3

Additional Transistor Count Reduction
Per Function Using Consolidation

| Multi-Bit count | Data-in Path | | Scan-in Path | | Set/Reset | |
|---|---|---|---|---|---|---|
| | SE | SEB | SE | SEB | Reset | Set |
| 2 | 1 | 1 | 1 | 1 | 3 | 3 |
| 4 | 3 | 3 | 3 | 3 | 7 | 7 |
| 8 | 7 | 7 | 7 | 7 | 15 | 15 |
| 16 | 15 | 15 | 15 | 15 | 31 | 31 |

TABLE 4

Additional Transistor Count Reduction
Per Flip-Flop Type Using Consolidation

| Multi-Bit count | No Scan | With Scan | Scan + reset | Scan + set/reset |
|---|---|---|---|---|
| 2 | 0 | 4 | 7 | 10 |
| 4 | 0 | 12 | 16 | 20 |
| 8 | 0 | 28 | 36 | 44 |
| 16 | 0 | 60 | 76 | 92 |

Notably, in standard cells, even small transistor reduction advantages amount to relatively large overall die-size savings on final logic chip products. For example, a transistor count reduction of 7% may have a corresponding die area shrinkage of 5%, which is considered significant in the semiconductor industry.

Figure 4A:
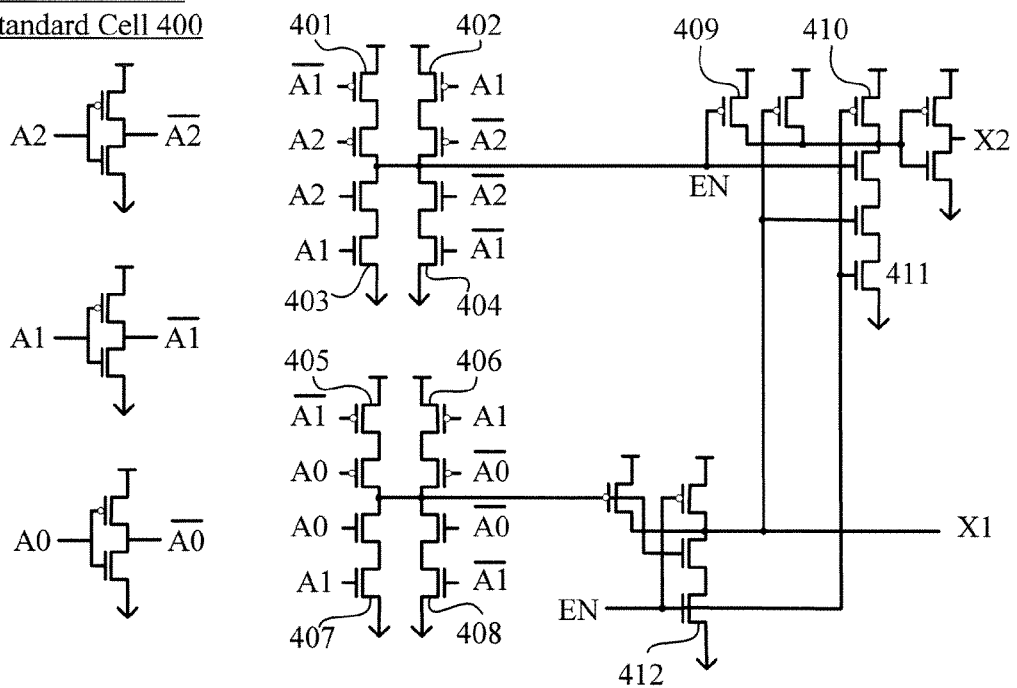
FIGS. 4A and 4B illustrate how the method of FIG. 2 can be implemented in an exemplary Booth recoder.
Figure 4B:
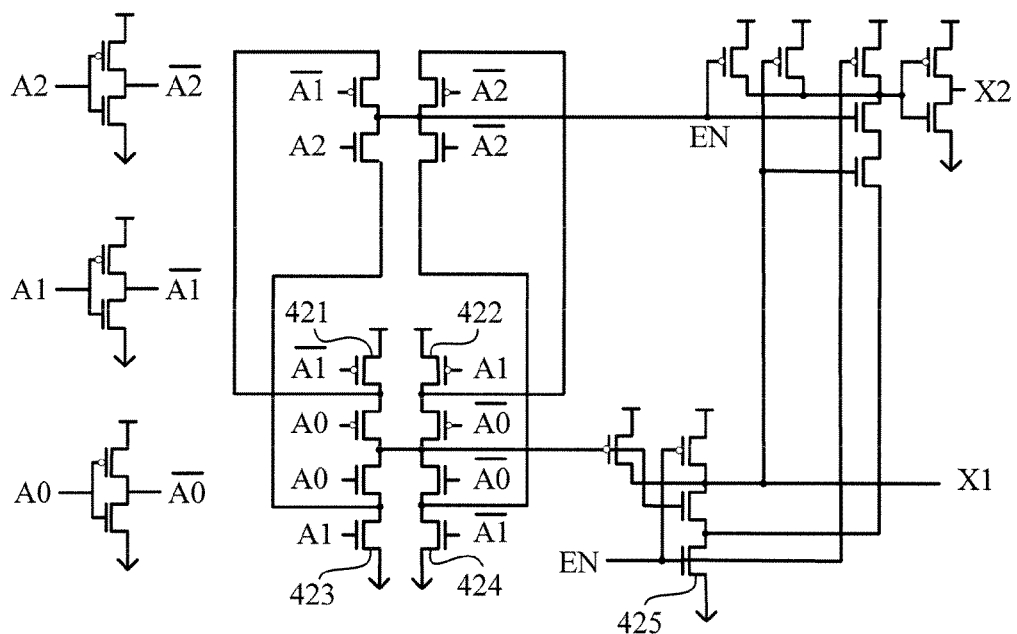

Note that the technique described in reference to FIG. 2 can be applied to various standard cells. For example, FIGS. 4A and 4B illustrate how the method of FIG. 2 can be implemented in an exemplary Booth recoder. Booth multiplication is a technique that provides for smaller, faster multiplication circuits, by recording the numbers that are multiplied. In general, the algorithm used in Booth multiplication multiplies two signed binary numbers in two's complement notation. FIG. 4A shows an exemplary Booth recorder standard cell 400, which receives combinatorial signals A0, A1, and A2 and generates outputs X1 and X2. In this embodiment, the first set of transistors that function to source power or ground can include transistors 401-412. The second set of transistors that receive identical signals and provide the same source can include PMOS transistors 401, 405 that receive signal A1 bar and source to power (VDD), PMOS transistors 402, 406 that receive signal A1 and source to power (VDD), NMOS transistors 403, 407 that receive signal A1 and source to ground, NMOS transistors 404, 408 that receive signal A1 bar and source to ground, and PMOS transistors 411, 412 that receive enable signal EN and source to ground.

FIG. 4B shows an exemplary Booth recorder standard cell 420 including a third set of transistors providing device consolidation. In this embodiment, the third set of transistors can include a PMOS transistor 421 (replacing transistors 401 and 405), a PMOS transistor 422 (replacing transistors 402 and 406), a NMOS transistor 423 (replacing transistors 403 and 407), a NMOS transistor 424 (replacing transistors 404 and 408), and a NMOS transistor 425 (replacing transistors 412 and 413). FIG. 4B shows the third set of transistors connected to the logic circuits of Booth recorder standard cell 420.

As shown above, the consolidation technique of FIG. 2 can be applied to various circuits. In general, devices that function to source power or ground to various parts of the logic circuits can be identified. These devices can then be consolidated into a single device (or perhaps in other embodiments, a few devices (2-4 transistors)) that functions for all bits for the entirety of the standard cell. The common, sourcing signal can then either float or is driven to the level it would have been in the single instance of the standard cell without any signal contention.

The invention can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

The various embodiments of the methods of this invention that are described above are illustrative only of the principles of this invention and are not intended to limit the scope of the invention to the particular embodiments described. Thus, the invention is limited only by the following claims and their equivalents.

The invention claimed is:

1. A method for designing a standard cell, the method comprising:
    identifying a first set of transistors, the first set of transistors functioning to source power or ground to circuits of the standard cell;
    determining and correlating a second set of transistors, the second set of transistors forming at least part of the first set of transistors, wherein the second set of transistors includes one or more correlated groups of transistors, wherein each correlated group of transistors includes a plurality of transistors that receive an identical signal and provide a same sourcing;
    creating a third set of transistors, the third set of transistors including fewer transistors than the second set of transistors;
    deleting the second set of transistors from the standard cell; and
    using a computer, connecting the third set of transistors to the circuits of the standard cell, wherein each transistor of the third set of transistors replaces a plurality of transistors of the second set of transistors.

2. The method of claim 1, wherein the standard cell is a multi-bit flip-flop.

3. The method of claim 2, wherein the identical signal includes at least one of scan enable, reset, and set signals.

4. The method of claim 1, wherein the standard cell is a Booth recorder.

5. The method of claim 4, wherein the identical signal includes at least one of enable and combinatorial signals.

6. The method of claim 1, wherein the first set of transistors is identical to the second set of transistors.

7. A non-transitory, computer-readable medium storing computer-executable instructions for designing a standard cell, the instructions when executed by a processor cause the processor to execute a process comprising:
    identifying a first set of transistors, the first set of transistors functioning to source power or ground to circuits of the standard cell;
    determining and correlating a second set of transistors, the second set of transistors forming at least part of the first set of transistors, wherein the second set of transistors includes one or more correlated groups of transistors, wherein each correlated group of transistors includes a plurality of transistors that receive an identical signal and provide a same sourcing;
    creating a third set of transistors, the third set of transistors including fewer transistors than the second set of transistors;
    deleting the second set of transistors from the standard cell; and
    using a computer, connecting the third set of transistors to the circuits of the standard cell, wherein each transistor of the third set of transistors replaces a plurality of transistors of the second set of transistors.

8. The non-transitory, computer-readable medium of claim 7, wherein the standard cell is a multi-bit flip-flop.

9. The non-transitory, computer-readable medium of claim 8, wherein the identical signal includes at least one of scan enable, reset, and set signals.

10. The non-transitory, computer-readable medium of claim 7, wherein the standard cell is a Booth recorder.

11. The non-transitory, computer-readable medium of claim 10, wherein the identical signal includes at least one of enable and A1 signals.

12. The non-transitory, computer-readable medium of claim 7, wherein the first set of transistors is identical to the second set of transistors.

13. An electronic design automation (EDA) program to be executed by a computer and stored on a non-transitory computer-readable medium, the EDA program comprising instructions, the instructions when executed by a processor cause the processor to execute a process comprising:
    identifying a first set of transistors, the first set of transistors functioning to source power or ground to circuits of the standard cell;
    determining and correlating a second set of transistors, the second set of transistors forming at least part of the first set of transistors, wherein the second set of transistors includes one or more correlated groups of transistors, wherein each correlated group of transistors includes a plurality of transistors that receive an identical signal and provide a same sourcing;
    creating a third set of transistors, the third set of transistors including fewer transistors than the second set of transistors;
    deleting the second set of transistors from the standard cell; and
    using the processor, connecting the third set of transistors to the circuits of the standard cell, wherein each transistor of the third set of transistors replaces a plurality of transistors of the second set of transistors.

14. The EDA program of claim 13, wherein the standard cell is a multi-bit flip-flop.

15. The EDA program of claim 13, wherein the identical signal includes at least one of scan enable, reset, and set signals.

16. The EDA program of claim 13, wherein the standard cell is a Booth recorder.

17. The EDA program of claim 16, wherein the identical signal includes at least one of enable and A1 signals.

18. The EDA program of claim 13, wherein the first set of transistors is identical to the second set of transistors.

* * * * *